United States Patent

Vittoz

[15] 3,700,916

[45] Oct. 24, 1972

[54] LOGICAL FREQUENCY DIVIDER

[72] Inventor: Eric Andre Vittoz, Neuchatel, Switzerland

[73] Assignee: Centre Electronique Horloger SA, Brequet, Neuchatel, Switzerland

[22] Filed: Nov. 15, 1971

[21] Appl. No.: 198,794

[30] Foreign Application Priority Data

Nov. 19, 1970 Switzerland .............17138/70

[52] U.S. Cl. ...............................307/215, 307/220 R

[51] Int. Cl. ............................................H03k 19/34

[58] Field of Search......307/214, 215, 218, 225, 220, 307/233

[56] References Cited

UNITED STATES PATENTS

| | | | |
|---|---|---|---|
| 3,206,683 | 9/1965 | Davis | 307/215 |
| 3,237,159 | 2/1966 | Emmons | 307/215 |
| 3,350,659 | 10/1967 | Henn | 307/215 |
| 3,382,455 | 5/1968 | Rapp | 307/215 |
| 3,457,434 | 7/1969 | Henn | 307/215 |
| 3,610,954 | 10/1971 | Treadway | 307/233 |

*Primary Examiner*—Herman Karl Saalbach
*Assistant Examiner*—Ro E. Hary
*Attorney*—Richard K. Stevens et al.

[57] ABSTRACT

A logical frequency divider comprising at least one stage of division by two consisting of four logical gates A, B, C and D, the gates being connected as follows: the output from the first gate A controls an input to the second gate B; the output from the second gate B controls an input to the first gate A and an input to the third gate C; the output from the third gate C controls a second input to the first gate A, a second input to the second gate B and an input to the fourth gate D; the output from the fourth gate D controls a third input to the second gate B, a second input to the third gate C. The input signal to the stage of division by two controls a third input to the third gate C and a second input to the fourth gate D.

6 Claims, 4 Drawing Figures

LOGICAL FREQUENCY DIVIDER

The invention relates to an improvement to frequency dividing circuits that are purely logical, operating with two voltage states (designated 0 and 1) without employing analogue methods such as deriving the flanks of the input signal waveform. These logical circuits have the advantage of being very well adapted for use with integration techniques.

Furthermore, to work at low supply voltages, it is very convenient to have recourse to certain circuit techniques, such as the DCTL (Direct Coupled Transistor Logic) technique, which allows to carry out only one-level gates (NOR or NAND).

Such logical frequency dividers are already known, and more particularly a divider in which each stage of division-by-two comprises six gates with a total of 13 inputs.

The object of the invention is to simplify such logical dividers, especially by reducing the number of gates.

According to the invention a logical frequency divider comprises at least one stage of division by two, consisting of four logical gates designated by A, B, C and D, respectively. The output from the first gate A controls an input to the second gate, the output from the second gate B controls an input to the first gate and an input to the third gate, the output of the third gate C controls a second input to the first gate, a second input to the second gate and an input to the fourth gate, the output from the fourth gate D controls a third input to the second gate and a second input to the third gate; finally, the input to the stage controls a third input to the third gate and a second input to the fourth gate.

A known logical dividing circuit as well as an embodiment of a logical frequency divider according to the invention will be described, by way of example with reference to the accompanying drawings, in which.

In the description that follows, the gates will be designated by the letters denoting their respective output variables.

Figure 1:
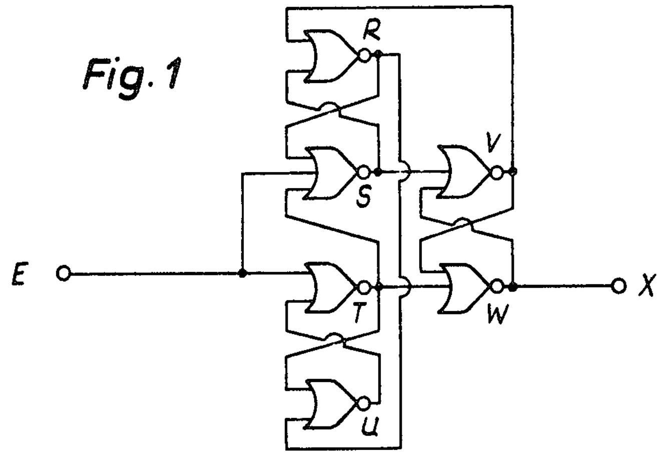
FIG. 1 is a diagram of the known divider.

The known divider shown in FIG. 1 comprises six NOR-gates R, S, T, U, V and W with a total of 13 inputs. The circuit in FIG. 1 forms a division-by-two stage with input at E and output at X.

Figure 2:
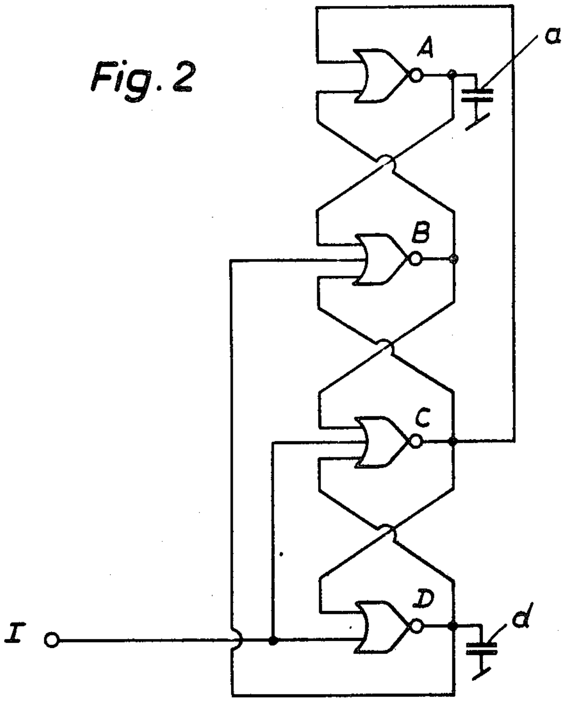
FIG. 2 is a diagram of the embodiment according to the invention.

The embodiment shown in FIG. 2 forms a division-by-two stage comprising four NOR-gates A, B, C and D. Gates A and D have two inputs and gates B and C three inputs. The output from gate A is connected to an input to gate B, the output from gate B to inputs to gates A and C, the output from gate C to inputs to gates A, B and D and the output from gate D to inputs to gates B and C. The input I to the divider stage is connected to inputs to gates C and D. In addition, the outputs A and D are grounded through capacitors a and d, respectively.

The divider stage output can be taken from any one of the gate outputs A, B, C or D.

Comparing the dividers shown in FIGS. 1 and 2, it can be seen that the latter comprises two gates and three inputs fewer than the former.

The Boolean equations for the divider of FIG. 2 are $$A=\overline{B+C}$$

$$B=\overline{A+C+D}$$

$$C=\overline{I+B+D}$$

$$D=\overline{I+C}$$

where I is the logical input variable to the stage. The analysis will show that any one of the four internal variables A, B, C or D can be chosen as output variable from the stage, as mentioned earlier.

Each of the above equations corresponds to one of the NOR-gates and states the value of the output variable as a function of the input variables for the particular gate.

The four internal variables A, B, C and D and the input variable I together give rise to a total of $2^5 = 32$ different states for the structure.

For ease of explanation, these 32 states will be coded by decimal numbers obtained by assigning a different binary weight to each variable, namely

| variable | I | A | B | C | D |
|---|---|---|---|---|---|
| weight | 16 | 8 | 4 | 2 | 1 |

For example, the state for which $$I=1,\quad A=0,\quad B=1,\quad C=1,\quad D=0$$

is represented by the code number $$1\times16+0\times8+1\times4+1\times2+0\times1=22.$$

Examination of the Boolean equations shows that they are simultaneously satisfied for the following four states:

| Code No. | I | A | B | C | D |
|---|---|---|---|---|---|
| 9 | 0 | 1 | 0 | 0 | 1 |
| 24 | 1 | 1 | 0 | 0 | 0 |
| 2 | 0 | 0 | 0 | 1 | 0 |
| 20 | 1 | 0 | 1 | 0 | 0 |

These four states are the stable states of the system.

Figure 3:
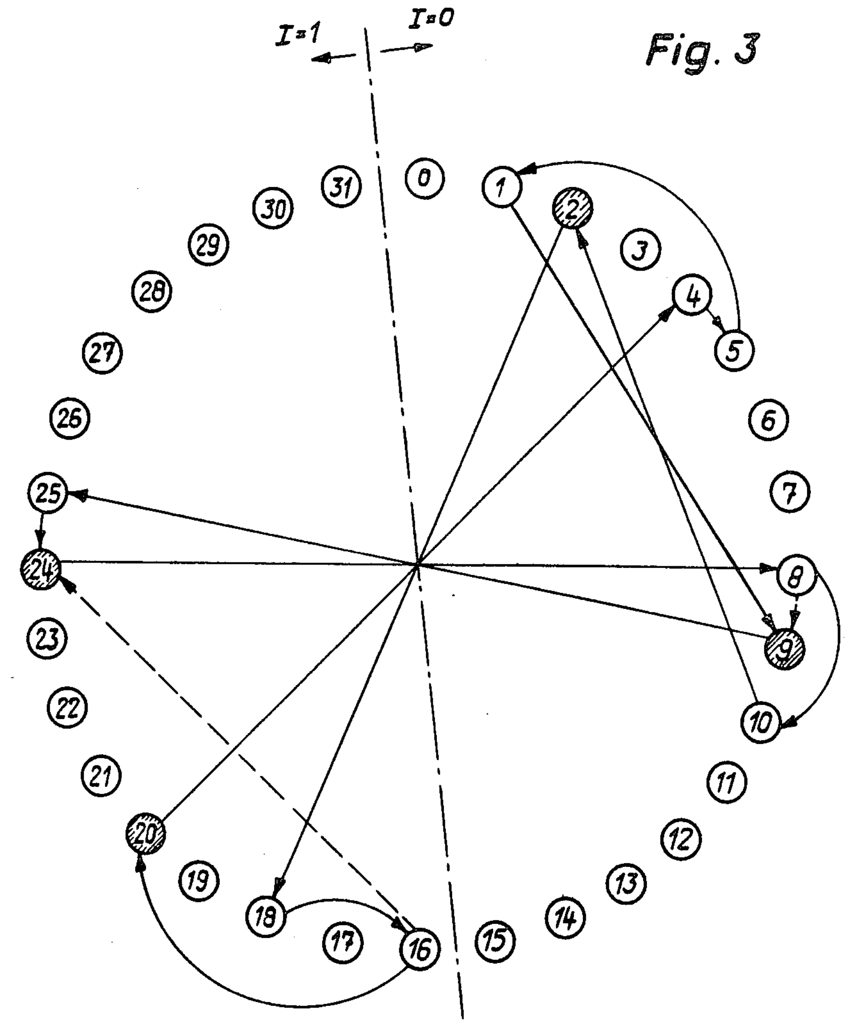
FIG. 3 is a diagram showing the different states of the divider.

With the aid of the equations, the diagram of FIG. 3 can be constructed and used for analyzing the transitions between stable states. All 32 possible states are represented. Starting from any one of the four stable states (cross-hatched) and then changing the input variable I, there will be one Boolean equation no longer satisfied; the corresponding (output) variable will tend to make a transition (*unstable state*), taking the system to a new state in which another variable will tend to make a transition, and so on until a new stable state is reached.

It should be noted that in the states 8 and 16 there are in fact two equations simultaneously not satisfied, so that two variables will tend to make transitions. Since completely simultaneous transitions are impossible, the one corresponding to the faster logical gate will occur; then in the new state the other variable may no longer tend to make a transition.

In the state 16, the variables A (weight 8) and B (weight 4) tend to make transitions. If A is faster, the system goes into the stable state 24 and B makes no transition. If B is faster, the system goes into the stable state 20 and A makes no transition.

In the state 8, the variables C (weight 2) and D (weight 1) tend to make transitions. If D is faster, the stable state 9 is obtained and C makes no transition. If C is faster, the unstable state 10 is obtained, followed by the stable state 2, and D makes no transition.

In order to reach the four stable states 9, 24, 2 and 20 in succession, it is clear that the transitions from 8 to 9 and from 16 to 24 must be prevented. This is done by making the gate D slower than C, and A slower than B, for example by changing the outputs A and D capacitively using the capacitors *a* and *d* of FIG. 2.

Figure 4:
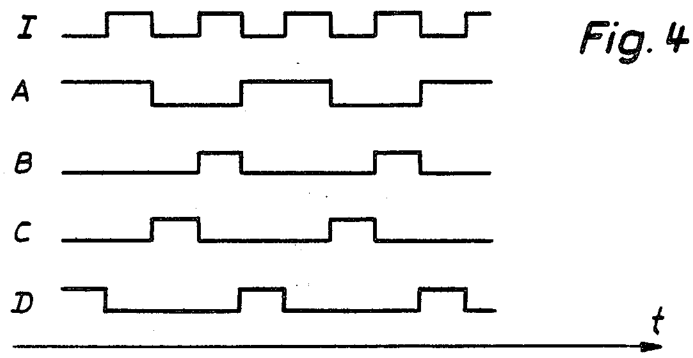
FIG. 4 shows the gate output levels as a function of time.

In this way, a divider that halves the frequency is obtained. As can be seen in FIG. 4, where the time variation of the five variables in the stable states is shown, the transition frequency of the variables A, B, C and D is half that of the input variable I.

Any number of identical stages can be put in cascade by connecting one of the outputs A, B, C or D of one stage to the input I of the following stage.

It is plain that the NOR-gates of the divider shown in FIG. 2 can all be replaced by NAND-gates; the preceding analysis remains valid on exchanging "0" and "1" everywhere, and replacing the operation OR (symbol +) by the operation AND (symbol ·) in the Boolean equations.

What is claimed is:

1. A logical frequency divider comprising at least one stage of division by two, consisting of four logical gates A, B, C and D, where the output from the first gate A controls an input to the second gate, the output from the second gate B controls an input to the first gate and an input to the third gate, the output from the third gate C controls a second input to the first gate, a second input to the second gate and an input to the fourth gate, the output from the fourth gate D controls a third input to the second gate and a second input to the third gate; and finally the input signal to the stage controls a third input to the third gate and a second input to the fourth gate.

2. A divider according to the claim 1, in which the gates are NOR-gates.

3. A divider according to the claim 1, in which the gates are NAND-gates.

4. A divider according to claim 2, comprising means for increasing the switching times of the first and fourth gates.

5. A divider according to the claim 4, in which the divider is made by integrated circuit techniques.

6. A divider according to claim 3 comprising means for increasing the switching times of the first and fourth gates.

* * * * *